Figure 1:
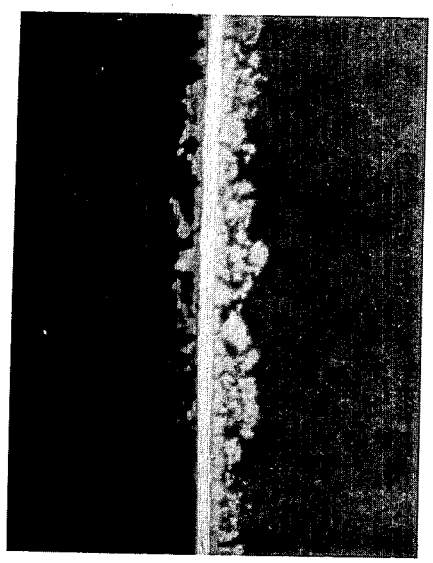

United States Patent [19]

Baldi

[11] Patent Number: 4,895,609
[45] Date of Patent: Jan. 23, 1990

[54] ACTIVATED METAL AND METHOD OF PREPARING

[75] Inventor: Alfonso L. Baldi, Wynnewood, Pa.

[73] Assignee: Alloy Surfaces Company, Inc., Wilmington, Del.

[21] Appl. No.: 205,387

[22] Filed: Jun. 10, 1988

Related U.S. Application Data

[63] Continuation-in-part of Ser. No. 182,718, Apr. 18, 1988, and a continuation-in-part of Ser. No. 96,368, Sep. 11, 1987, and a continuation-in-part of Ser. No. 830,767, Feb. 19, 1986, Pat. No. 4,799,979, and a continuation-in-part of Ser. No. 685,910, Dec. 27, 1984, Pat. No. 4,820,362, and a continuation-in-part of Ser. No. 538,541, Oct. 3, 1983, Pat. No. 4,830,931, which is a continuation-in-part of Ser. No. 531,444, Sep. 12, 1983, abandoned, and a continuation-in-part of Ser. No. 507,174, Jun. 23, 1983, Pat. No. 4,694,036, and a continuation-in-part of Ser. No. 417,214, Sep. 13, 1982, abandoned, and a continuation-in-part of Ser. No. 359,212, Mar. 18, 1982, Pat. No. 4,443,557, and a continuation-in-part of Ser. No. 281,405, Jul. 8, 1981, Pat. No. 4,708,913, and a continuation-in-part of Ser. No. 172,671, Jul. 28, 1980, Pat. No. 4,435,481, said Ser. No. 685,910, is a continuation-in-part of Ser. No. 507,174, , and a continuation-in-part of Ser. No. 281,405, , and a continuation-in-part of Ser. No. 531,444, , said Ser. No. 830,767, is a continuation-in-part of Ser. No. 507,174, , and a continuation-in-part of Ser. No. 281,405, , said Ser. No. 96,368, is a continuation-in-part of Ser. No. 281,405.

[51] Int. Cl.$^4$ ............................................. C06B 45/30
[52] U.S. Cl. ........................................ 149/5; 149/15; 149/22; 149/109.6; 419/8; 419/9; 428/550; 428/553
[58] Field of Search ............... 149/109.6, 5, 15, 22; 419/8, 9; 428/550, 553

[56] References Cited

U.S. PATENT DOCUMENTS 4,349,612  9/1982  Baldi .................................... 149/15
4,799,979  1/1989  Baldi ...................................... 149/5

OTHER PUBLICATIONS

Paper by Zuhair A. Munir in Ceramic Bulletin, vol. 67, No. 2, 1988, pp. 342–349, it is believed to have been published in Feb. 1988.

Paper by V. I. Itin et al. in Sov. Powd. Met. Ceram., vol. 2, No. 170, pp. 87–90 (1977).

Translation of Pater by V. V. Boldyrev et al. in Doklady Akademii Nauk, SSSR, vol. 259, No. 5, pp. 1127–1129 (1981).

Paper by K. A. Philpot, et al., J. Materials Sc., 22, 159–169 (1987).

*Primary Examiner*—Stephen J. Lechert, Jr.

[57]  ABSTRACT

Metals are made pyrophoric by diffusing aluminum or zinc into them and then leaching it out, or by reacting with aluminum and then leaching aluminum out. Powdered aluminum and powdered nickel, iron or cobalt, can thus be carried on an elongated support web and reacted by heating for a few seconds to a few minutes, after which leaching will provide elongated pyrophoric foil suitable for decoying heat-seeking missile.

16 Claims, 1 Drawing Sheet

ACTIVATED METAL AND METHOD OF PREPARING

This application is in part a continuation of parent applications

| Ser. No. | Filing Date |
| --- | --- |
| 182,718 | April 18, 1988 |
| 96,368 | September 11, 1987 |
| | (U.S. Pat. No. 4,799,979) |
| 830,767 | February 19, 1986 |
| | (U.S. Pat. No. 4,820,362) |
| 685,910 | December 27, 1984 |
| 538,541 | October 3, 1983 |
| | (U.S. Pat. No. 4,830,931) |

538,541 is in turn a continuation-in-part of

| Ser. No. | Filing Date | Status |
| --- | --- | --- |
| 531,444 | September 12, 1983 | subsequently abandoned |
| 507,174 | June 23, 1983 | U.S. Pat. No. 4,694,036 |
| 417,214 | September 13, 1982 | subsequently abandoned |
| 359,212 | March 18, 1982 | U.S. Pat. No. 4,443,557 |
| 281,405 | July 8, 1981 | U.S. Pat. No. 4,708,913 |
| 172,671 | July 28, 1980 | U.S. Pat. No. 4,435,481 |

Ser. No. 685,910 is in its turn a continuation-in-part of Ser. Nos. 507,174 and 281,405, while Ser. No. 96,368 is also a continuation-in-part of Ser. No. 281,405.

The present invention relates to the preparation of activated metals, and more particularly metals that are highly reactive and/or very good catalysts.

Among the objects of the present invention is the provision of novel methods for effecting the activation.

Additional objects of the present invention include the provision of novel forms of activated metal.

Figure 2:
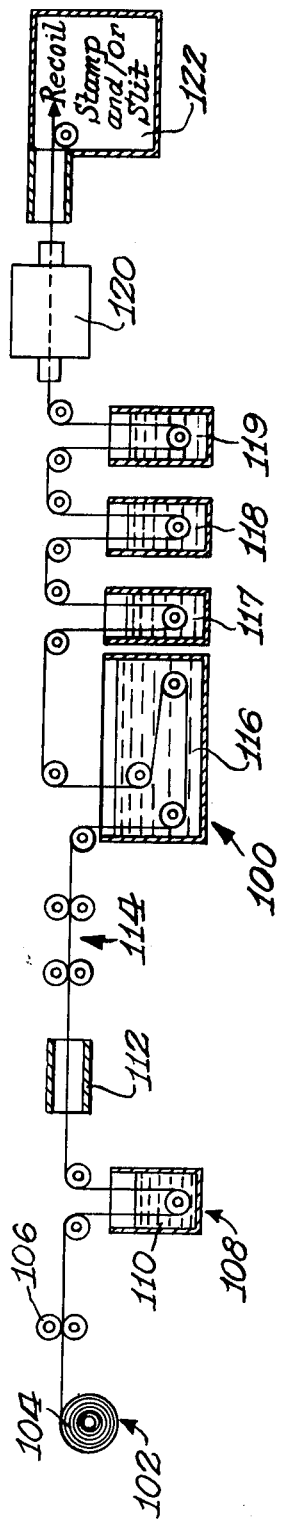

The foregoing as well as further objects of the present invention will be more fully understood from the following description of several of its exemplifications, reference being made to the accompanying drawings in which:

FIG. 1 is a sectional view, highly enlarged, of an activated product pursuant to the present invention; and FIG. 2 is a schematic production line for producing the product of FIG. 1.

The low-temperature diffusion aluminizing of steels to make a pyrophorically-activated product as described in the parent applications, is desirably combined with a diffusion boronizing that follows the aluminizing. The introduction of as little as 2% boron or even less, into such aluminized steels noticeably increases the pyrophoric heat evolution after the steel is subsequently activated by leaching out some of the aluminum and the thus-activated boronized steel exposed to the air.

Diffusion coating to catalytically activate the surface of a metal foam, such as nickel foam described in U.S. Pat. No. 3,111,396, is particularly desirable inasmuch as such a foam presents a very large metal surface and does not have the fragility of thin foil or screening. The diffusion-coating treatment generally introduces into the surface of the metal being activated a relatively high concentration of an embrittling metal such as aluminum, and fragile shapes such as foil and thin screening tend to break unless very carefully handled during this treatment.

The catalytic activation of platinum and other metals of the platinum family is preferably applied to very thin substrates in the interest of reducing the amount of such expensive metals needed and here also a metal foam shape as described in U.S. Pat. No. 3,111,396 is desirable.

To minimize having thin nickel foil rendered too fragile by the aluminizing, the diffusion step can be carried out at minimum temperatures to reduce the depth of the diffusion case. Thus a 0.1 to 0.5 mil, or even a 1 mil, case can be provided on a nickel foil 1 to 2 mils thick by aluminizing at a temperature between 650° and 800° to 900° F. The foil is increased in thickness by the aluminizing, so that a heavy aluminizing of a one-mil thick foil can yield a product 2.5 to 3 or more mils thick with each face having an aluminized case and both cases together occupying about 2 to 2.6 mils of that thickness.

The fragility of thin foils when diffusion coated, can also be offset by having the metal of the foil in the form of a surface layer securely held on a carrier foil or sheet made of metal that does not have the objectionable fragility and can be subsequently separated from that surface layer. Thus a 5 mil thick aluminum sheet can have electroplated on one face a one mil thick layer of nickel or cobalt, using a preliminary flash coating of chromium or zinc to get the nickel or cobalt to adherently deposit. The final coated aluminum sheet is then subject to a 20-hour diffusion treatment at 750° to 850° F. in a hydrogen-bathed atmosphere to cause the aluminum to diffuse most of the way through the nickel or cobalt layer, after which the resulting product is subjected to caustic leaching to dissolve the aluminum. This leaves a catalytically active nickel or cobalt foil that contains a residual small content of diffused-in aluminum and holds itself together adequately for normal handling. Although pyrophoric, its catalytic activity is not as high as is available from a pack diffusion process without the aluminum carrier sheet, but it does a good job of catalyzing hydrogenation and other chemical reactions including ammonia oxidation and HCN formation. Of particular interest, a Ni or Co plating formed by electroplating in the above manner has a particularly low density thus limiting the amount of mass needed per unit volume of catalyst.

Both faces of the aluminum sheet can be given nickel or cobalt platings in which case the corners or edges of the plated sheet can be trimmed off to expose the aluminum substrate for leaching.

A very effective zinc flash for the foregoing plating sequence is obtained by a ½ to 1 minute dip of the cleaned aluminum sheet at room temperature in the following solution:

| NaOH | 525 grams |
| --- | --- |
| ZnO | 100 grams |
| $FeCl_3.6H_2O$ | 1 gram |
| $NaKC_4H_4O_6.4H_2O$ | 10 grams |
| Water | to make one liter |

Platinum and other catalytic metals can similarly be converted to catalytic foil, and other leachable metals like zinc can be used as the supporting foil in place of aluminum. The supporting layer can also be made by spraying molten aluminum or zinc on a surface of the foil that is to be activated.

Palladium is best catalytically activated with zinc. A simple diffusion of about 1 to 30 milligrams of zinc per square centimeter of palladium surface, followed by leaching with strong, at least 10%, HCl in water at 95°

C., produces from a 1 mil thick foil a very effective catalyst. A typical pack diffusion treatment for palladium is the embedding of a 52-mesh palladium screen the wires of which are 4 mils thick, in a pack of 20% powdered zinc and 80% alumina, energized with ½% NH$_4$Cl, and heating for 4 hours at 600° F. in a hydrogen-bathed or argon-bathed atmosphere. This effects a zinc pick-up of 4 mg/cm$^2$, essentially all of which is leached out by 20% HCl in 10 minutes. The resulting screen is pyrophoric when exposed to air.

Zinc can be similarly diffused into titanium foil in a hydrogen-bathed or argon-bathed atmosphere from such a zinc-containing pack. As an example a 4 mil thick titanium foil is embedded in a pack having the following composition:

| | |
|---|---|
| 80 g | Zn |
| 16 g | Al |
| 305 g | Al$_2$O$_3$ |
| 4 g | AlCl$_3$ | and subjected to 10 hours of diffusion at 950° to 1000° F. The foil picks up about 3.5 milligrams of zinc per square centimeter. It is worthy of note that the titanium does not become seriously embrittled by such treatment, and can be bent around a ⅛-inch radius without cracking. The diffused-in zinc can be leached out with 20% boiling NaOH solution to leave a very active catalytic surface. Titanium activated this way still retains a little of the zinc and can be used as a conventional electrolysis electrode, or as a substitute for photosensitive electrodes such as described in the Augustynski et al paper in the Journal of the Electrochemical Society, Volume 124, No. 7, pages 1063-64 (1977).

Titanium activated by aluminizing and leaching can also be so used. Such titanium, still containing a little of the aluminum, can be heated in air or under other oxidizing conditions to convert some of its porous activation case to mixed titanium aluminum oxides and such a treated titanium makes a very effective photo-anode for photolysis of water containing a little NaOH. Even without the heat-treatment it is a very good photo-anode. Tin can also be diffused into titanium to provide similar results with and without the subsequent oxidation.

Whether the zincized, aluminized or stannized titanium is used as a photo-electrode, a platinum or platinized platinum or activated platinum counter-electrode is helpful. Activated platinum made as described in U.S. Pat. No. 4,154,705 is particularly helpful. A little ruthenium, such as 1 to 5% by weight can be incorporated in the titanium before it is aluminized, zincized or stannized, as a further improvement.

Instead of using separate electrodes for the photolysis, they can be provided in powdered form and mixed with each other as well as with other substances such as cadmium sulfide that also help with the photolysis.

Hydrogen peroxide appears to form during the foregoing photolysis and some exothermic heat is also generated and can be used to help keep the photolysis combination warm.

For some purposes, such as catalytic alkylation, it is helpful to have a catalytic tin surface. Inasmuch as tin is a very low melting metal, it is helpful to first diffuse the tin into a high-melting support such as nickel. By way of example an 80-mesh nickel gauze made of 4 mil thick wire, is embedded in the following pack:

| | |
|---|---|
| Tin powder | 73 grams |
| Nickel powder | 27 grams |
| Alumina | 300 grams |
| NH$_4$Cl | 4 grams | which pack had been pre-fired at 1000° F. for 5 hours and then had its NH$_4$Cl content replenished. Diffusion is conducted in hydrogen at 1400° F. for 5 hours to give a 20 milligram per square centimeter pick-up. The resulting tin-containing gauze after removal from the pack, is subjected to post diffusion by heating in hydrogen at 1600° to 1700° F. for 5 hours to leave the diffusion case about 1.3 mils thick. This product is now activated by a pack diffusion at 850° to 900° F. for 30 hours using a pack having 20% powdered aluminum, 80% powdered alumina, and energized with ½% anhydrous aluminum chloride. The aluminized product is then subjected to leaching with 10% NaOH solution to extract most of the diffused-in aluminum and leave an activated tin-nickel surface.

An activated copper-palladium surface can be prepared as by first electroplating a 1 mil thick layer of copper on a 1 mil thick palladium foil, heating the copper-palladium combination in hydrogen at 1050°-1100° F. for 12 hours to diffuse the copper deeply into the palladium, and then diffusion coating the resulting product under hydrogen in a pack containing 10% zinc, 90% alumina, and activated with ½% NH$_4$Cl. Ten hours of such treatment at 660°-690° F. produces a pick-up of about 7 milligrams of zinc per square centimeter of foil surface and a 0.7 mil thick case the surface stratum of which contains about 25% zinc. The final step in the activation is a leaching in 30% HCl for 3 minutes at about room temperature followed by 10 minutes more at about 212° F. in 15% HCl.

The pack diffusion to activate any of the catalysts of the present invention can be effected in one step or in multiple diffusion steps under different diffusion conditions to vary the distribution of the diffused-in metal. Regardless of how the diffusion is carried out, the pyrophoricity of the leached product can be entirely blocked by immersing the activated surface in an aqueous solution of a chromate such as an alkali metal, magnesium or ammonium chromate or chromic acid. A concentration of about 1% chromate ion is all that is needed to inhibit essentially all the otherwise intense pyrophoric activity of nickel for example, after only a few seconds contact. Smaller concentrations, a low as 0.1% chromate ion, will also be effective if kept in contact for longer times.

A catalyst so inhibited can be conveniently stored or shipped without being immersed in a protective liquid. Moreover the catalyst can subsequently be pyrophorically reactivated by merely treating it for about 2 minutes with 5% aqueous NaOH, preferably at 10° C. Rinsing away this treating liquid will then leave the catalyst with almost all of its original activity.

The chromate treatment does not significantly reduce the catalytic activity of the catalysts even though it kills the pyrophoricity. Indeed as shown in parent Ser. No. 531,444, such treatment can increase catalytic activity.

The catalytic activity withstands intense evacuation, although the activated surface gives off large quantities of hydrogen under the influence of the lowered pressure.

Activated nickel surfaces can also be modified by dipping for a few seconds in aqueous hydrogen peroxide. A three volume percent $H_2O_2$ solution modifies the surface and turns it black so that it is no longer pyrophoric. The modified surface is however still catalytic and will for example show a strong decrease in overvoltage when used as a cathode or anode in electrolyzing aqueous NaOH to generate gas. The activation of platinum or its alloys can be similarly modified by immersion in aqueous $H_2O_2$ or in aqueous HCl at least 20% strong.

A readily ignited metal such as titanium or magnesium in foil or wire form can also be given a nickel coating, as by rolling, and the nickel coating then rendered pyrophoric. To ignite the ignitable metal the coating should be at least about 0.4 mil thick.

The pyrophoric metals, regardless of how they are produced, can be plated as by electrolytic coatings from alkaline cyanide baths of zinc, cadmium, silver, tin or copper, without significantly diminishing their pyrophoricity. Such coatings that are over about 0.2 mil thick will significantly reduce the pyrophoric action.

Platinum activated by the aluminum diffusion and leaching, still contains a significant amount of the aluminum. Even when heated to high temperatures, such as 1800° to 2300° F. for days or weeks, that residual aluminum remains in the outermost 0.3 mil or so of the metal. This platinum wire so treated shows greater useful life at very high temperatures, e.g. 1800° F. or higher. The increased life appears to be a characteristic of platinum that is alloyed with from about 0.5 to about 5% aluminum and has been heated to from 1800° to 2300° F. for at least a week. This improvement is most significant for very fragile wires such as those not over about 10 mils thick. Thus wires less than 4 mils thick when used as catalytic screens in gaseous reactions, are subjected to vibratory flexure by the flow of reacting gases, as well as attack by naturally occurring catalyst poisons swept along by those gases. The aluminum-containing platinum stands up much better in such service than aluminum-free platinum.

Platinum freshly activated by aluminum diffusion and leaching, has a characteristic fissured surface illustrated in U.S. Pat. No. 4,154,705 and it would not be expected that longer mechanical life could be obtained with such a surface. However after days of service at extremely high temperatures, the fissures become less pronounced, but the wire remains rough.

The presence of up to about 15% of other platinum metals alloyed with the platinum and the aluminum, does not significantly reduce the life-lengthening effect of the aluminum. Thus a platinum-rhodium alloy screen made of 3 mil thick wire containing 10% rhodium, that is further alloyed with 2% aluminum, also shows a markedly long service life at 1800° F. and higher. Similar results are obtained when iridium is substituted for some or all of the rhodium.

Instead of introducing the aluminum into the platinum by diffusion, it can more inexpensively be introduced by melt alloying, for example at the same time rhodium is alloyed with the platinum. Wire drawn from the resulting alloy does not have the very high catalytic activity of platinum activated by surface diffusion and leaching as described above, but it is still strongly catalytic and it also has the long service life.

When the aluminum is introduced into a platinum screen by low-temperature diffusion, that is diffusion below about 900° F., the aluminum introduction is generally very slight or completely absent at locations such as wire crossover points where one wire touches another and at least partially blocks the diffusing action. Although little or no aluminum is located at those points, the resulting screen performs even better than one which has been subjected to heavy aluminizing that reaches 100% of its surface. A similar improvement can be obtained on heavily aluminized screen by following the caustic leach with an acid treatment, HCl for example, that leaches out extra amounts of aluminum.

The improved service life can be obtained when the aluminum-carrying platinum is subjected to the preliminary heat treatment in air, in a vacuum, in nitrogen, hydrogen or in catalytically reacting gases. It appears that 1800° to 2300° F. temperature for the minimum of one week is the key to long life.

Pyrophorically activated nickel and iron also retain some of the aluminum or zinc or the like used to activate them, even though these activating metals are leached out with strong hot aqueous caustic for 12 hours or more. When such leached pyrophoric products are dipped in 1 to 5% aqueous $H_2O_2$ for about ¼ to about 1 hour, their pyrophoricity is sharply reduced or entirely eliminated. Notwithstanding such reduction the products are still strongly catalytic. A nickel screen having forty 10 mil wires per inch, and diffusion aluminized at 950° F. for 16 hours followed by 2 hours of leaching in 20% aqueous NaOH at 180° F. with a final 30 minute dip in 2% aqueous $H_2O_2$, develops an activated case about 1.6 mils thick and shows a very low overvoltage as a cathode in electroyzing water containing a little dissolved KOH. Although the freshly leached screen is not pyrophoric, after two to four weeks electrolyzing the water, it tends to become pyrophoric. At this point a three-hour dip in 160° F. tap water will eliminate the pyrophoricity.

Although the screen pyrophoricity tends to increase while it is used as an electrolysis electrode, its catalytic effectiveness tends to very gradually drop during such use. After several years of such use, the screens are desirably re-activated by subjecting them to another aluminizing treatment followed by another leaching out of aluminum. The activated surface can be removed beforehand by prolonged exposure to dilute aqueous mineral acid.

Diffusion aluminizing also protects workpieces against high-temperature corrosive attack, as in jet engines, particularly with the help of a top coating as in Example I of U.S. Pat. No. 3,948,689, or Example III of U.S. Pat. No. 4,141,760, or in parent Ser. No. 417,214, or in Canadian Pat. No. 779,173. Particularly good results are obtained with 0.1 mil thick coatings from suspensions of 1 to 3 micron ground aluminum particles in the aqueous magnesium phosphate-chromate formulations of the Canadian patent. Such very small particle sizes are more effective than the 5 to 10 micron size suggested in that patent. The aqueous suspension can also contain colloidal alumina or silica instead of applying such colloidal material as a preliminary layer in the manner described in the U.S. patents. Whichever modification is used, the top coating should be baked at about 650° to 700° F. for at least about 30 minutes, to provide still better protection. It can be alternatively or additionally subjected to barrel burnishing with steel, ceramic, or plastic burnishing media. The top coating can also be applied as multiple layers.

The aluminizing of the present invention can also be used to prepare aluminized steel, iron, nickel or other substrates for conversion to Raney-type activated metals, as described in U.S. Pat. No. 4,154,705. Both self-supporting substrates and powdered substrates can be so activated and such activation of powders is described in parent Ser. No. 507,174. This type of treatment provides the greatest degree of activation for foils or other self-supporting substrates when the aluminizing is effected at the lowest temperatures —below 1000° F.— and at such low temperatures energizers such as inexpensive ammonium halides give undesirable diffusion cases. Aluminum halide activators give better results, as does water-insoluble $CrCl_3$.

The pyrophoric effects of the Raney-type activated metals is further improved by diffusing boron into the surface being activated. This is shown in the following example:

EXAMPLE 1

Three-hundred grams of powdered 325 mesh $FeAl_2$ is thoroughly mixed with 10 grams powdered boron and 6 grams of powdered $NaBF_4$. The mixture is placed in a carbon steel retort which is then fitted into a tube furnace, and heated while a flushing gas is passed through the tube as in Example 1. A heat of 1800° F. held there for 1½ hours under hydrogen, introduces about 7% boron into the $FeAl_2$ powder, based on its iron content.

The retort contents are partially sintered together as a result of the diffusion heat, but can be fairly easily removed from the retort after banging the outside of the retort with hammers or mallets. Crushing and/or grinding readily reduces the mass to very small particle size. Then on leaching aluminum out of the resulting product mass as by a 60-minute treatment in 15-16% aqueous NaOH that is cooled to keep it below 120° F., followed by washing, the activated particles remaining are quite pyrophoric and on exposure to air heat up to temperatures of about 1000° F. Higher and lower leaching concentrations and temperatures can also be used, but are less desirable.

Longer diffusion boronizing provides, after leaching, an activated iron-aluminum-boron alloy powder containing as much as 30% boron based on the weight of its iron, and which upon exposure to air heats up to over 1200° F. Boron contents greater than about 30% provide decreasing heat-up and at about 40% leave the leached powder non-pyrophoric. It is preferred that the boron penetrate through the entire thickness of each powder particle and that each particle have a uniform composition throughout its thickness.

Similar results are obtained when $FeAl_3$ powder is used in place of the $FeAl_2$, when alloys of intermediate proportions are used, and when the corresponding nickel-aluminum alloys are used. Some of the alloys are not as brittle, and therefore not as easily grindable as others. If the iron-aluminum alloy powder particles being boronized are over about 1 millimeter in size, the boronizing treatment times should be substantially lengthened to make the boron penetration complete. Other boronhalides such as ammonium fluoborate, $BBr_3$ and $BI_3$ can be used as energizers. In general the energizer content of the pack should be from about 1 to about 3% by weight, and the diffusion temperature at least about 1400° F.

By not using an inert refractory diluent in the boronizing pack, it becomes unnecessary to later separate such diluent from the boronized powder.

The foregoing boronizing of self-supporting substrates such as foild requires much more care and should be conducted with inert refractory diluent in the pack. Thus, conducting the same boronizing on lengths of one-mil thick aluminized iron foil is awkward because such foil is extremely brittle and difficult to handle. The following is a preferred example.

EXAMPLE 2

Such boronizing can be satisfactorily effected in the following powder pack:

| | |
|---|---|
| 200 grams | powdered alumina |
| 10 grams | powdered boron |
| 5 grams | sodium or ammonium fluoborate, | at 950° F. for 18 hours, or at 1050° F. for 3 hours, in a hydrogen-bathed atmosphere. The boron then penetrates about half way through the aluminized case.

Aluminum loss to the boron in the pack also takes place. The aluminizing of an iron-boron alloy in an attempt to introduce sufficient aluminum to give a pyrophoric product after leaching, causes excessive loss of boron from the substrate to the pack.

The activated powders containing boron, or even free of boron, are stored out of contact with air or oxygen to preserve their pyrophoricity. Water is not a suitable preserving liquid for the activated boron-containing powders. Acetone preserves them for at least three weeks, as does an azeotropic mixture of trifluorotrichloro ethane with methylene chloride, described in U.S. Pat. No. 2,999,817. Ordinary fluoro-chloro ethanes and methanes that are normally used as refrigerants or propellants are also suitable and they can be used by themselves or mixed with each other or with acetone. Mixtures of the activated powders with preserving liquids that are also propellants, are particularly desirable in that they can be packed in an aerosol-type container from which they are readily discharged to provide a cloud of pyrophorically oxidizing particles.

Titanium can also be aluminized and/or boronized by the same type of treatments, to make it more resistant to corrosive attack. For this purpose the aluminum is not leached out. It is also very desirable to diffusion coat titanium in the absence of hydrogen and in the complete or substantially complete absence of conventional halide activators like $AlCl_3$ and $NH_4Cl$. Thus engine compressor blades made of Ti6Al4V can be embedded in a pack of 20% Al-Si alloy powder containing 12% silicon, and 80% alumina, completely free of energizer, and at 1300° F. for 14 hours under argon, acquires a protective aluminide case 0.5 to 1 mil thick. Using pure aluminum instead of the Al-Si alloy reduces the case thickness by about half.

Adding ¼% $AlCl_3$ or $NH_4Cl$ energizer to the pack causes the titanium substrate to be significantly embrittled. However the aluminizing can be speeded by using a pack that had been pre-fired with such a halide energizer for a time long enough to drive out essentially all the energizer—at least one to two hours at 700° F. or higher. It appears that some energizer remains or some change is caused, to make the pre-fired pack much more effective in aluminizing the titanium. In any event the resulting aluminizing produces thicker cases, and can be readily effected at temperatures as low as 1000° F. or in times as short as 5 hours.

The addition to the pack of about 1/10% of a titanium halide such as $TiCl_2$, preferably sealed in a polyethylene tube so as to be protected against exposure to the atmosphere, is also helpful to speed up the diffusion coating. The polyethylene tube melts before the pack reaches diffusion temperature, releasing its contents.

The aluminized titanium compressor blades can then be boronized instead of or before applying a top coating as described above in connection with the Canadian patent. A suitable boronizing pack for this purpose is the diluent-containing pack of Example 2, using ammonium fluoborate as the energizer and with added titanium powder in an amount about half the amount of boron powder, by weight. A 0.3 mil boronized case is thus formed at 1075° F. for 14 hours in argon. The titanium powder helps keep the titanium substrate from being attacked by the halide in the pack, and can also be added to the pack used for aluminizing titanium. It can also be omitted, particularly when only a thin diffusion coating is desired. When the powdered titanium is used, it can range from about 1/5 the boron content to about equal the boron content by weight. Boron being a very high melting material, it can be used with little or no refractory diluent, particularly at diffusion temperatures low enough to keep the workpiece surfaces from reaching a sintering condition. On the other hand the boron content of a boronizing pack can be as low as 2%, although at least 4% is preferred. To be sure that no sintering takes place an inert refractory diluent like $Al_2O_3$, kaolin or MgO can be present in the pack in a concentration of at least 30%.

The re-use of packs containing sodium fluoborate energizer can be complicated by the gradual build-up of sodium fluoride with each use. This problem does not appear to arise when ammonium fluoborate is the energizer.

A preferred technique for preparing activated foil is to apply a Raney type layer to one or both faces of a foil substrate, using a sintering technique. Thus a mixture of nickel and aluminum powders the particles of which are from about 1 to about 12 microns in size, are in a proportion of 3 atoms aluminum to 1 atom nickel slurried in a 2% solution of polyethylacrylate in methyl chloroform, and the resulting slurry sprayed onto a 50 micron thick steel foil to build up a coating particle thickness of about 25 to about 50 to 100 microns on each face. The thus-coated foil is then dried to volatilize off its solvent content, and then embedded in a pack of chromium granules held in a metal retort. A stream of argon is flushed through the retort and then replaced with a stream of hydrogen, while the retort is heated to about 815° C. for about 90 minutes. The retort is then cooled and the coated foils removed. They now show rough sintered-on metal faces which when leached as described above show excellent pyrophoric action.

The nickel and aluminum particles are known to inter-react very aggressively, and the retort heating time can be reduced to as little as 5 minutes or even less. It takes a very few minutes, and with the use of high temperatures only a few seconds, for the powders to reach their inter-reacting temperature of about 300° to 500° Centigrade, and once they start to inter-react they generate sufficient heat to take the coatings to above 750° C. to thus complete the sintering to the substrate foil. That substrate can be as thin as 10 microns to further increase the final pyrophoric heat output.

It is not necessary to use a retort. A preheated tube through which argon or hydrogen or nitrogen, can have passed through it a foil carrying on one face the foregoing coating. In about one minute or less the nickel-aluminum reaction takes place to leave a sintered-on product that after leaching shows excellent pyrophoric action.

Steel foil is a very inexpensive substrate, but other metal substrates such a nickel or stainless steel or copper or brass foils can be used. Any substance that will withstand the treatment conditions and not disintegrate, even a carbon fiber web, is a suitable carrier substrate.

Iron powder can be substituted for the nickel powder, preferably with the iron-aluminum atom ratio of 1:2 to 1:4, and similar results are obtained.

Cobalt can also be substituted for the nickel, without changing its proportion to aluminum.

The chromium granule bed can be replaced by a bed of powdered alumina, and the hydrogen flush by a helium, or nitrogen or argon flush, without significantly altering the results. The retort atmosphere need not contain any diffusion activator to improve the sintering action.

Where a foil with only one pyrophoric surface is desired, the nickel and aluminum particles can be applied with or without a binder, to the top of a horizontally oriented substrate foil, and as above noted the powder-carrying foil heated to reaction temperature without embedding it in a pack. The retorting time for such a treatment is reduced to less than 15 seconds, inasmuch as there is no pack to heat up.

The foregoing powder-sintering techniques are particularly suited for preparing pyrophoric foil on a continuous basis. Thus a roll of ½, 1 or 2-mil thick substrate foil can be unspooled and passed through gas seals into and out of a heated argon or hydrogen-filled retort or tube in a relatively cool portion of which the inter-reacting powders are poured onto the foil. After the desired dwell in the hot part of the retort or tube the coated foil is pulled out and then through a leach bath where the leaching is completed while the coated foil travels at the same rate as it does in the sintering, so that the sequence can be realistically conducted using a retort path as short as ½ to 1 meter to achieve a high output rate.

Where the final foil is desired to have both surfaces pyrophoric, the sintering step can be repeated with the substrate foil held upside down and a fresh sintering mixture applied to the surface that now faces upwardly. Alternatively the coating slurry can be sprayed onto both surfaces and then only one heat treatment used.

The proportions of aluminum to nickel or iron can be varied about plus or minus 20% with little loss of effectiveness. The proportion of aluminum should not be below the limit for Raney alloy. A Raney alloy is here defined as an alloy that when leached with aqueous caustic becomes pyrophoric. The sintering powder can have its nickel and iron mixed together in any proportin to vary the pyrophoric action. Also the final foil can be made with activated iron on one face and activated nickel on its other face. The activated nickel pyrophorically reacts more sharply but that reaction is completed in substantially less time, so that the dual coatings work a balancing of the reactions on their separate faces. the particles the more rapid and effective is the sintering, and the use of high heating temperatures such as 500° to 1000° C., preferably 600° to 900° C. also helps.

The foil can be perforated, as by punching out adjacent circular portions about 25 to about 150 microns in diameter. At least about 25 microns of spacing between adjacent punchings will leave sufficient metal in the powder-carrying web to provide the support needed for handling. A perforated web reduces the amount of non-pyrophoric material in the final leached product, and in this way improves the pyrophoric action.

Expanded metal is a desirable form of perforated metal.

Wire screening also makes a very desirable support web. A screen of stainless steel wires 25 to 50 microns in diameter spaced 25 to 50 microns apart is particularly strong, especially when heated to about 650° C. to 825° C., so that it makes a very dependable support web for a commercial operation.

Where the web perforations are larger than the powder particles, the powder is preferably applied in slurry form as noted, so that they are better held in place. Where the perforations are close together, such a slurry need only be applied, as by spraying, on one face of the web inasmuch as some of the slurry will move through the perforations to the opposite face of the web. Dipping is also practical.

Continuous strips of pyrophoric metal are accordingly readily manufactured by feeding from a continuous coil lengths of foil, expanded metal or wire cloth past a spray gun or roller coater that applies a slurry of the foregoing powders, then through the tube of a tube furnace heated to about 500° to 1,000° C. so that each increment of the slurry-carrying screening is dried and subject to that high temperature for not over about two seconds to three minutes. A protective gas such as argon or hydrogen can be flowed through the tube around the slurry-carrying web, as in FIG. 1 of parent patent 4,708,913.

After emerging from the heated tube the coated web is passed through a caustic leach bath which, at about 10 to 20% NaOH concentration at about 50° to 85° C., leaches out sufficient aluminum in two to five minutes to yield a very effective pyrophoric product. Such product is illustrated in FIG. 1, where 10 is the product, 12 is the carrier web, and 14 is the sintered activated powder. Although quite porous, that sintered-on mass is held in place.

Where iron powder is reacted with aluminum powder, the leach solution is preferred to also contain dissolved stannite and a little hydrogen peroxide, as described in parent Ser. No. 182,718.

The foregoing coatings are openly porous in that they are composed of pyrophoric particles sintered together in spaced locations that leave spaces between the particles. In the outer portion of the coating those spaces are essentially at least as wide as the particles themselves.

The particles themselves also have a microporous structure as shown in U.S. Pat. No. 4,154,705.

The development of the openly porous array during the leaching makes the leaching more effective, so that for coatings not over about ½ mm thick the leaching can be completed in not over about 5 minutes, and can be as short as 2 minutes.

The openly porous coating is also readily compacted, as by passing the coated and leached web through the bight of a pair of steel rolls that are pressed together by a force of about 50 kilograms per inch of axial length. Such compacting reduces the overall thickness of the coated and leached web as much as 40 to 50 percent, and even a 20% reduction provides a compacted product that can be packed in materially higher concentration in a decoy-discharge cannister or shell.

The compacting or rolling can be effected in one or two or more steps, and does not materially loosen the coated particles.

The activated product 10 can now be cut into pieces suitable for discharging as decoy-chaff against heat-seeking missiles. The product can also be coated with materials that shift the wave length pattern of the pyrophoric radiation, as described in parent Ser. Nos. 830,767 and 96,368.

AISI 1010 steel or iron or bronze or nickel foil, expanded or perforated metal or wire screening can be substituted for the stainless steel web, and are helpful in that they at least partially oxidize during the pyrophoric action and thus increase the pyrophoric output.

The powders that are sintered together can have added ingredients. Thus a little powdered $NiAl_3$ or $FeAl_3$ can be incorporated in the powder mixture, to moderate the inter-reaction with the aluminum. These high aluminides can constitute up to about ⅓ of the total powder mix.

There can be alternatively or additionally added powdered boron, zirconium, titanium, thermite mixture or similar additive that improves the heat generation in the pyrophoric reaction of the activated material. When boron is added, this can be done before or after the heat treatment, and preferably constitutes only about ½% to about 5% of the powder mix when added before the heat treatment.

The presence of at least about 0.5% boron in the powder mixture greatly improves the adhesion of the pyrophoric coat to stainless steel and to nickel, but not to plain carbon steel or iron.

The reaction between the metal powders is so rapid that it is not necessary to make absolutely certain that atmospheric oxygen be kept out of the reaction atmosphere. When the reaction is conducted by a five-second pass of the supported powders through a 800° C. tube having a diameter as large as about 5 centimeters and about 50 centimeters long open at both ends, the product is not significantly adversely affected should the flow of protective gas be interrupted. The coated product will then show some signs of surface oxidation, but its pyrophoric effectiveness is not significantly diminished.

Also the supported powders as they are introduced into the reaction zone can be wet with a little water or contain some other volatilizable ingredient such as chromium chloride, that vaporizes to help provide a protective atmosphere.

The following are working examples of the sintering technique, in each of which the powder mixture was applied as a slurry:

| Example | Coating Mixture | | Support Base | Application Mode | Furnace Temperature and Time | Leach Bath and Time | Final Thickness in mm | Peak Pyrophoric Temperature |
|---|---|---|---|---|---|---|---|---|
| 3 | 23.8 g Al<br>11.2 g Ni<br>15.0 g $NiAl_3$ | 3–4 microns<br>10 microns<br>325 mesh<br>97% methyl chloroform | type 304 stainless steel screen<br>325 mesh<br>3/40 mm | Spray | 650° C.<br>15 seconds | 20% aqueous NaOH<br>93° C.<br>2½ minutes | 9/40 | 900° C. |

-continued

| Example | Coating Mixture | | Support Base | Application Mode | Furnace Temperature and Time | Leach Bath and Time | Final Thickness in mm | Peak Pyrophoric Temperature |
|---|---|---|---|---|---|---|---|---|
| 4 | 60.0 g 3% polyethyl acrylate<br>27.2 g Al 3 microns<br>12.8 g Ni 10 microns<br>10 g NiAl$_3$ 325 mesh<br>0.5 g B amorphous −325 mesh<br>60 g solution of Ex 3 | | stainless steel foil 1/40 mm thick | Same as for Example 3 | 815° C.<br>2 seconds | Same as for Example 3 | 1/4 | 1000° C. |
| 5 | Same as for Example 4 | | nickel foil 1/20 mm thick | | Same as for Example 4 | | 12/40 mm | |
| 6 | 20 g Fe 4 microns<br>30 g Al 3–4 microns<br>1 g B amorphous −325 mesh<br>60 g solution of Ex 3 | | Same as for Example 3 | | 650° C.<br>1 minute | 20% aqueous NaOH containing 1% SnCl$_2$ 12H$_2$O 2½ minutes | 11/40 mm | 1050° C. |
| 7 | 27.0 g Al 3–4 microns<br>12.5 g Fe 4 microns<br>10.5 g Ni 10 microns<br>0.3 g B amorphous −325 mesh<br>60 g solution of Ex 3 | | AISI 1010 Steel foil 1/40 mm thick | Spray | 810° C.<br>3 minutes | Same as for Ex. 6 | 6/40 mm | 1000° C. |
| 8 | Same as for Example 4 | | expanded 304 stainless steel foil 3/40 mm thick with 1¼ mm openings | Spray | 650° C. | Same as for Ex. 3 | 13/40 mm | 1050° C. |
| 9 | Same as for Example 4 | | 4/10 mm thick carbon fiber cloth | Spray | 650° C.<br>1 minute | Same as for Ex. 3 | 5/8 mm | 975° C. |
| 10 | 130 g Al 3–4 microns<br>64 g Ni 10 microns<br>44 g NiAl$_3$ −325 mesh<br>180 g Solution of Ex 3 | | Screen of Example 3 | Two dips with intervening drying | 650° C.<br>30 seconds | Same as in Ex. 3 but for 3 minutes | 8/40 mm | 850° C. |
| 11 | 13.6 g Al 3–4 microns<br>6.4 g Ni 10 minutes<br>5.0 g NiAl$_3$ −325 mesh<br>15.0 g water containing 0.05 g Triton wetting agent | | Screen of Example 3 | Spray two coats with intervening drying | 650° C.<br>15 seconds | Same as in Ex. 10 | 8.5/40 mm | 825° C. |

Paper made of interfelted carbon fibers also makes a satisfactory carrier web. The reacted particles adhere to such web even though the web does not have significant porosity.

Turning now to FIG. 2, this schematically shows a production line 100 having a number of stations through which work is continuously moved to produce a pyrophoric product. An uncoiling station 102 has a coil 104 of carrier substrate that is uncoiled by feed rollers 106, and fed through a coating station 108 where it is dipped in a slurry 110 of powder to be reacted. Upon leaving the slurry the powder-carrying substrate is moved through reactor 112 where it is heated to reaction temperature, after which it moves through an open space 114 where the reacted product cools and then moves through leach tank 116. After the leach, the leached product is rinsed by passing through water in tanks 117, 118 and 119, and it can then be passed through a top coating and/or compacting station 120 before it goes into receiving chamber 122 where it can be recoiled, and/or severed into the small discs or the like usually loaded into decoy shells. The severing can be accomplished while the product is still quite wet with rinse water, so that it is not contacted by air. The container can be fitted with a supply of heated or unheated argon or the like that flows out the wet product inlet to help dry the product. Drying can be effected before station 120 or before chamber 122 in which event an inert atmosphere should protect the dry product.

As top coatings to help provide good spectral distribution of the radiated heat, mixtures of boron and silicon are very effective when the silicon is from about equal to the boron content up to about 19 times that content, as disclosed in Ser. No. 96,368. Top coatings less than about 10 microns thick do not materially interfere with the pyrophoric action.

For some purposes it is helpful to have pyrophoric decoy pieces that when discharged into the air from a rapidly moving aircraft, do not immediately slow down and stop their discharge movement. To this end the pieces can be contained in a wire netting that permits them to spread out to only about 1 meter when discharged. Alternatively or additionally, the decoy pieces can be made so that their air resistance is small and inertia high. Thus the carrier web can be tantalum, silver or lead foil as much as ¾ mil thick, and only about 1 square centimeter discs. Silver webs also contribute very good electrical conductivity that provides the pieces with an electrical dipole that helps decoy against radar signals. Copper has a similar dipole effect.

The decoying action can be modified by arranging for a succession of decoy charges to be expelled by a moving aircraft in 20 to 30 second intervals, for example. This appears to a heat-seeking missile as a series of hot clouds that move with the aircraft, and thus becomes a more attractive decoy target.

The pyrophoric product is also a very effective catalyst for different kinds of chemical and electrochemical reaction, such as electrolysis of water with very low over-voltages, ammonia oxidation, CO oxidation and NOX removal. This catalytic quality remains essentially unaffected after the pyrophoric product is permitted to undergo its pyrophoric reaction with air. The pyrophoric product can also be stabilized by exposure to small concentrations of air under conditions that keep it from getting warm enough to rapidly react, as described in parent Ser. No. 685,910.

Obviously many modifications and variations of the present invention are possible in the light of the above teachings. It is, therefore, to be understood that within the scope of the appended claims the invention may be practiced otherwise than as specifically described.

I claim:

1. In the process of preparing a continuous length of pyrophoric metal, the steps of providing a continuous length of a carrier web not over about ¾ millimeter thick, applying to the web a layer at least about 1/50 millimeter thick of a mixture of aluminum powder and nickel, iron or cobalt powder, the powders being in the proportion of a Raney alloy, and the powder particles being sufficiently small to essentially completely interact when heated, and heating the layer-carrying web to cause the powder particles to essentially completely interact and adhere to the web, the web being sufficiently heat resistant so that it is not disintegrated by the process.

2. The combination of claim 1 in which the heating is for a time no longer than about three minutes.

3. The combination of claim 1 in which the heating step is followed by a caustic leach to convert the interacted particles into pyrophoric metal.

4. The combination of claim 3 in which after the conversion into pyrophoric metal the web-supported pyrophoric metal is cut into pieces suitable for decoying heat-seeking missiles.

5. The combination of claim 1 in which the web is perforated and the powder mixture is applied as a slurry in a binder-containing liquid.

6. The combination in claim 5 in which the web is a length of screening.

7. The product produced by the combination of claim 1.

8. The product produced by the combination of claim 3.

9. The combination of claim 3 in which the powder mixture also contains about ½ to about 5% boron.

10. The combination of claim 1 in which the heating is for a time no longer than about 3 seconds.

11. The combination of claim 3 in which the leached product is subjected to a compaction step to reduce the overall thickness of and compact the leached layer.

12. The combination of claim 1 in which the carrier web is a metal foil not over about ¼ millimeter thick.

13. A pyrophoric foil having a core web not over about ¾ mm thick to which is anchored a layer at least about 1/50 mm thick, the layer being an openly porous array of pyrophoric particles sintered together, the particles themselves having a microporous structure.

14. The combination of claim 13 in which the particles are sintered to the core web.

15. The combination of claim 13 in which the web is fenestrated and the particles penetrate through the web openings.

16. The combination of claim 13 in which the core web is metal and is not over about 1/10 mm thick.

* * * * *